United States Patent
Lee et al.

(10) Patent No.: US 8,310,432 B2
(45) Date of Patent: Nov. 13, 2012

(54) GATE DRIVING CIRCUIT, DISPLAY DEVICE HAVING THE SAME, AND METHOD FOR MANUFACTURING THE DISPLAY DEVICE

(75) Inventors: Min-Cheol Lee, Seoul (KR);
Hyung-Guel Kim, Seongnam-si (KR);
Jin Jeon, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 630 days.

(21) Appl. No.: 12/509,679

(22) Filed: Jul. 27, 2009

(65) Prior Publication Data

US 2010/0026669 A1  Feb. 4, 2010

(30) Foreign Application Priority Data

Aug. 1, 2008  (KR) .................. 10-2008-0075691

(51) Int. Cl.
*G09G 3/36* (2006.01)

(52) U.S. Cl. ........ 345/100; 345/204; 345/519; 345/520; 377/64; 377/68; 377/70; 377/74

(58) Field of Classification Search .................. 257/59, 257/60; 345/100, 519, 520, 204; 377/64–81; 438/154–166
See application file for complete search history.

(56) References Cited

U.S. PATENT DOCUMENTS

| | | | | |
|---|---|---|---|---|
| 5,536,932 A | * | 7/1996 | Hack et al. | 250/208.1 |
| 5,648,662 A | * | 7/1997 | Zhang et al. | 257/59 |
| 5,811,328 A | * | 9/1998 | Zhang et al. | 438/166 |
| 5,920,772 A | * | 7/1999 | Lin | 438/158 |
| 6,323,068 B1 | * | 11/2001 | Seo | 438/154 |
| 7,183,148 B2 | * | 2/2007 | Yazaki et al. | 438/166 |
| 2001/0038099 A1 | * | 11/2001 | Yamazaki et al. | 257/72 |
| 2003/0231735 A1 | * | 12/2003 | Moon et al. | 377/64 |
| 2004/0197972 A1 | * | 10/2004 | Adachi et al. | 438/166 |
| 2006/0029426 A1 | * | 2/2006 | Kikuchi et al. | 399/139 |
| 2007/0040793 A1 | * | 2/2007 | Kim et al. | 345/100 |
| 2007/0171115 A1 | * | 7/2007 | Kim et al. | 341/155 |
| 2008/0090340 A1 | * | 4/2008 | Hsu et al. | 438/154 |

FOREIGN PATENT DOCUMENTS

| | | |
|---|---|---|
| JP | 08097428 | 4/1996 |
| JP | 2003273366 | 9/2003 |
| KR | 1020070074826 | 7/2007 |

* cited by examiner

*Primary Examiner* — Lun-Yi Lao
*Assistant Examiner* — Gregory J Tryder
(74) *Attorney, Agent, or Firm* — Cantor Colburn LLP

(57) ABSTRACT

A gate driving circuit having improved driving capability and maintaining reliability even after a prolonged period of use includes a shift register having a plurality of stages cascaded to one another, each of the plurality of stages including a pull-up unit, a pull-down unit, a discharging unit, and a holding unit, wherein at least one of the discharging unit and the holding unit includes an amorphous silicon thin film transistor and a polysilicon thin film transistor connected in parallel to each other.

28 Claims, 11 Drawing Sheets

GATE DRIVING CIRCUIT, DISPLAY DEVICE HAVING THE SAME, AND METHOD FOR MANUFACTURING THE DISPLAY DEVICE

This application claims priority to Korean Patent Application No. 10-2008-0075691, filed on Aug. 1, 2008, and all the benefits accruing therefrom under 35 U.S.C. §119, the contents of which in its entirety are herein incorporated by reference.

BACKGROUND OF THE INVENTION

1. Field of the Invention

The present invention relates to a gate driving circuit, a display device having the same, and a method for manufacturing the display device, and more particularly, to a gate driving circuit having improved driving capability and maintaining reliability even after a prolonged period of use, a display device having the gate driving circuit, and a method for manufacturing the display device.

2. Description of the Related Art

As modern society rapidly changes toward an information-oriented society, demand in the market has increased for a slimmer and lighter panel display. The conventional display device, such as a cathode ray tube ("CRT"), is not suited to such demand. Accordingly, flat panel display ("FDP") devices, such as a plasma display panel ("PDP") device, a plasma address liquid crystal display panel ("PALC") device, a liquid crystal display ("LCD") device, and an organic light emitting diode ("OLED") device, are explosively increasing. In particular, demand for display devices having superior characteristics and advantages such as enhanced picture quality, reduced weight, and a slim profile, is explosively increasing.

A display device generally includes a lower substrate having thin film transistors ("TFTs") arranged thereon, an upper substrate opposite to the lower substrate, and a layer of a liquid crystal material being interposed between the lower and upper substrates, and displays an image by adjusting the intensity of an electric field applied to the liquid crystal layer. The display device includes a gate driving circuit for driving a display panel, and a data driving circuit that outputs an image signal to the display panel.

The gate driving circuit for the display panel of the display device may include a gate driving integrated circuit ("IC"). The gate driving IC may be mounted in the form of a tape carrier package ("TCP") or a chip on glass ("COG"). The gate driving circuit may be formed directly in the display panel. In terms of the manufacturing cost, size or design of device, various advantageous methods are being attempted. For example, the conventional gate driving circuit for generating gate signals may be formed directly on the display panel of amorphous-silicon thin film transistors ("a-Si TFTs"), instead of using the gate driving IC.

BRIEF SUMMARY OF THE INVENTION

It has been determined herein, according to the present invention, that the attempt of directly mounting the gate driver on the display panel may involve a space limitation. Accordingly, the present invention provides a display device having a gate driver capable of ensuring reliability even after a prolonged use without lowering the driving capability while occupying a smaller area by the gate driver.

The present invention provides a gate driving circuit having improved driving capability and maintaining reliability even after a prolonged period of use.

The present invention also provides a display device having a gate driving circuit having improved driving capability and maintaining reliability even after a prolonged period of use.

The present invention also provides a method for manufacturing a display device having a gate driving circuit having improved driving capability and maintaining reliability even after a prolonged period of use.

The above and other features and advantages of the present invention will be described in or be apparent from the following description of the exemplary embodiments.

According to exemplary embodiments of the present invention, there is provided a gate driving circuit including a shift register having a plurality of stages cascaded to one another, each of the plurality of stages including a pull-up unit outputting a first clock signal as a gate signal in response to a signal of a first node to which a first input signal is applied, a pull-down unit discharging the gate signal to a level of a gate-off voltage if a second input signal is inputted, a discharging unit discharging a signal of the first node in response to the second input signal to the level of gate-off voltage, and a holding unit holding the signal of the first node in response to the first clock signal at a level of the gate signal discharged to the level of the gate-off voltage, wherein at least one of the discharging unit and the holding unit includes an amorphous silicon thin film transistor ("TFT") and a polysilicon TFT connected in parallel to each other.

According to other exemplary embodiments of the present invention, there is provided a gate driving circuit including a shift register having a plurality of stages cascaded to one another, each of the plurality of stages including a pull-up unit outputting a first clock signal as a gate signal in response to a signal of a first node to which a first input signal is applied, a pull-down unit discharging the gate signal to a level of a gate-off voltage if a second input signal is inputted, a discharging unit discharging a signal of the first node in response to the second input signal to the level of gate-off voltage, and a holding unit holding the signal of the first node in response to the first clock signal at a level of the gate signal discharged to the level of the gate-off voltage, wherein a first area in which an amorphous silicon TFT is formed, and a second area in which a polysilicon TFT is formed are provided in the gate driving circuit.

According to still other exemplary embodiments of the present invention, there is provided a display device including a display panel divided into a display area in which an image is displayed and a peripheral area surrounding the display area, and a gate driving circuit disposed in the peripheral area and including a shift register having a plurality of stages cascaded to one another to output a gate signal to a gate line, each of the plurality of stages including a pull-up unit outputting a first clock signal as a gate signal in response to a signal of a first node to which a first input signal is applied, a pull-down unit discharging the gate signal to a level of a gate-off voltage if a second input signal is inputted, a discharging unit discharging a signal of the first node in response to the second input signal to the level of gate-off voltage, and a holding unit holding the signal of the first node in response to the first clock signal at a level of the gate signal discharged to the level of the gate-off voltage, wherein at least one of the discharging unit and the holding unit includes an amorphous silicon TFT and a polysilicon TFT connected in parallel each other.

According to further exemplary embodiments of the present invention, there is provided a display device including a display panel divided into a display area in which an image is displayed and a peripheral area surrounding the display area, and a gate driving circuit disposed in the peripheral area and including a shift register having a plurality of stages cascaded to one another to output a gate signal to a gate line, each of the plurality of stages including a pull-up unit outputting a first clock signal as a gate signal in response to a signal of a first node to which a first input signal is applied, a pull-down unit discharging the gate signal to a level of a gate-off voltage if a second input signal is inputted, a discharging unit discharging a signal of the first node in response to the second input signal to the level of gate-off voltage, and a holding unit holding the signal of the first node in response to the first clock signal at a level of the gate signal discharged to the level of the gate-off voltage, wherein the gate driving circuit includes a first area in which an amorphous silicon TFT is formed, and a second area in which a polysilicon TFT is formed.

According to yet other exemplary embodiments of the present invention, there is provided a method for manufacturing a display device, the method including forming a gate driving circuit including a plurality of amorphous TFTs on a display panel, the plurality of amorphous TFTs divided into a first area and a second area, and crystallizing the amorphous TFTs formed in the first area into polycrystalline TFTs by annealing the first area using laser.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
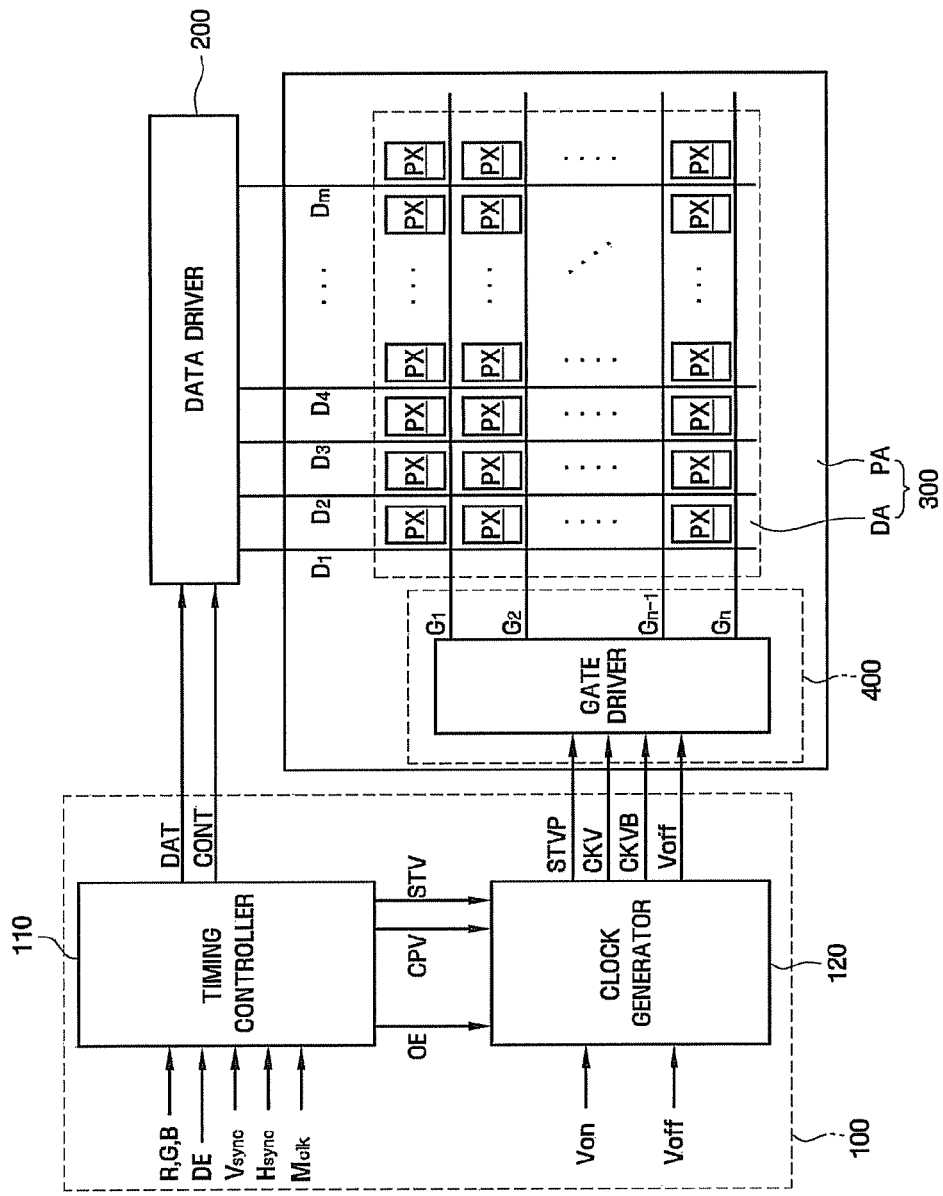
FIG. 1 is a block diagram showing an exemplary display device according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention will now be described more fully hereinafter below in more detail with reference to the accompanying drawings.

Figure 2:
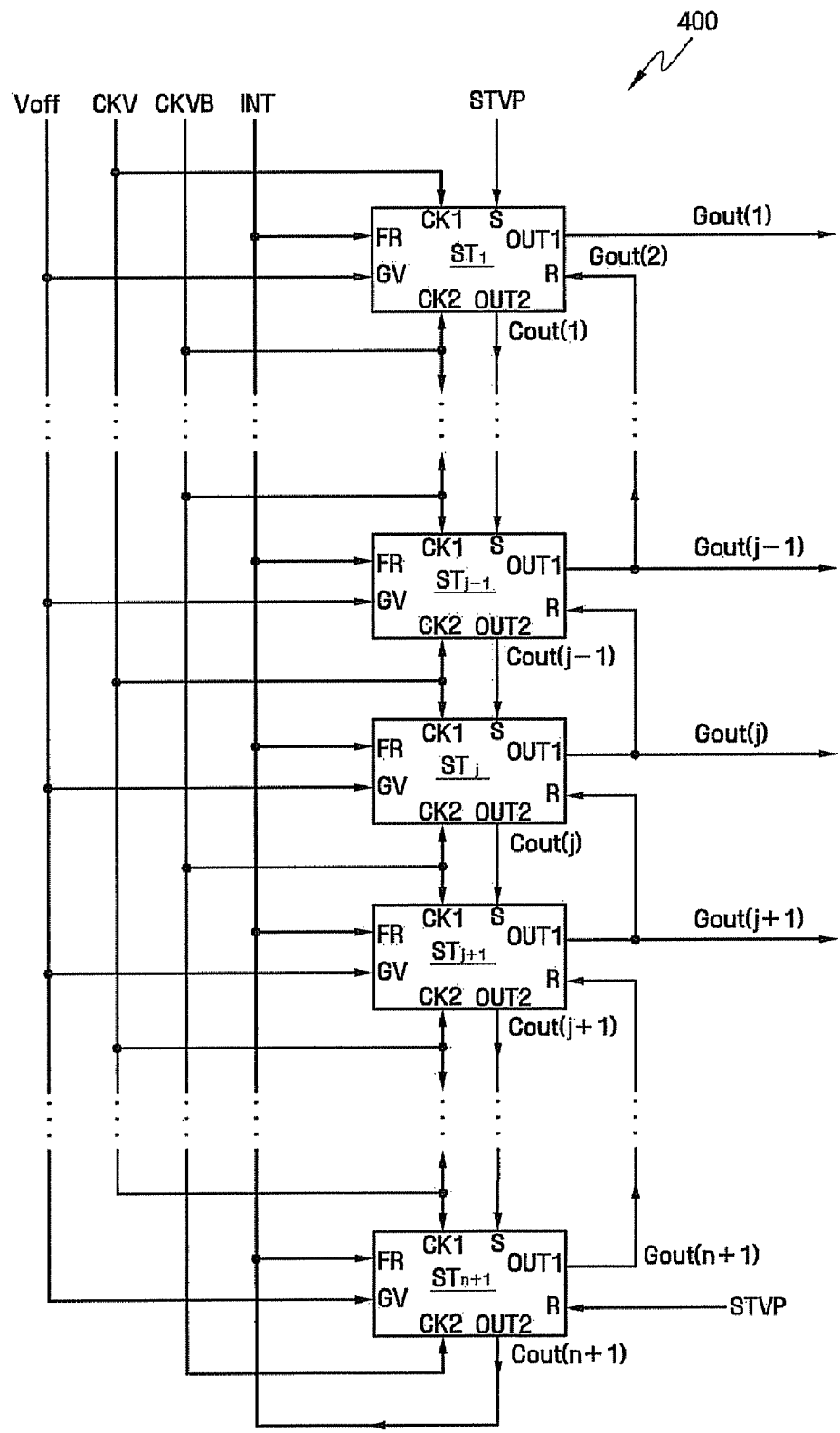
FIG. 2 is a block diagram showing an exemplary gate driver shown in FIG. 1.
Figure 3:
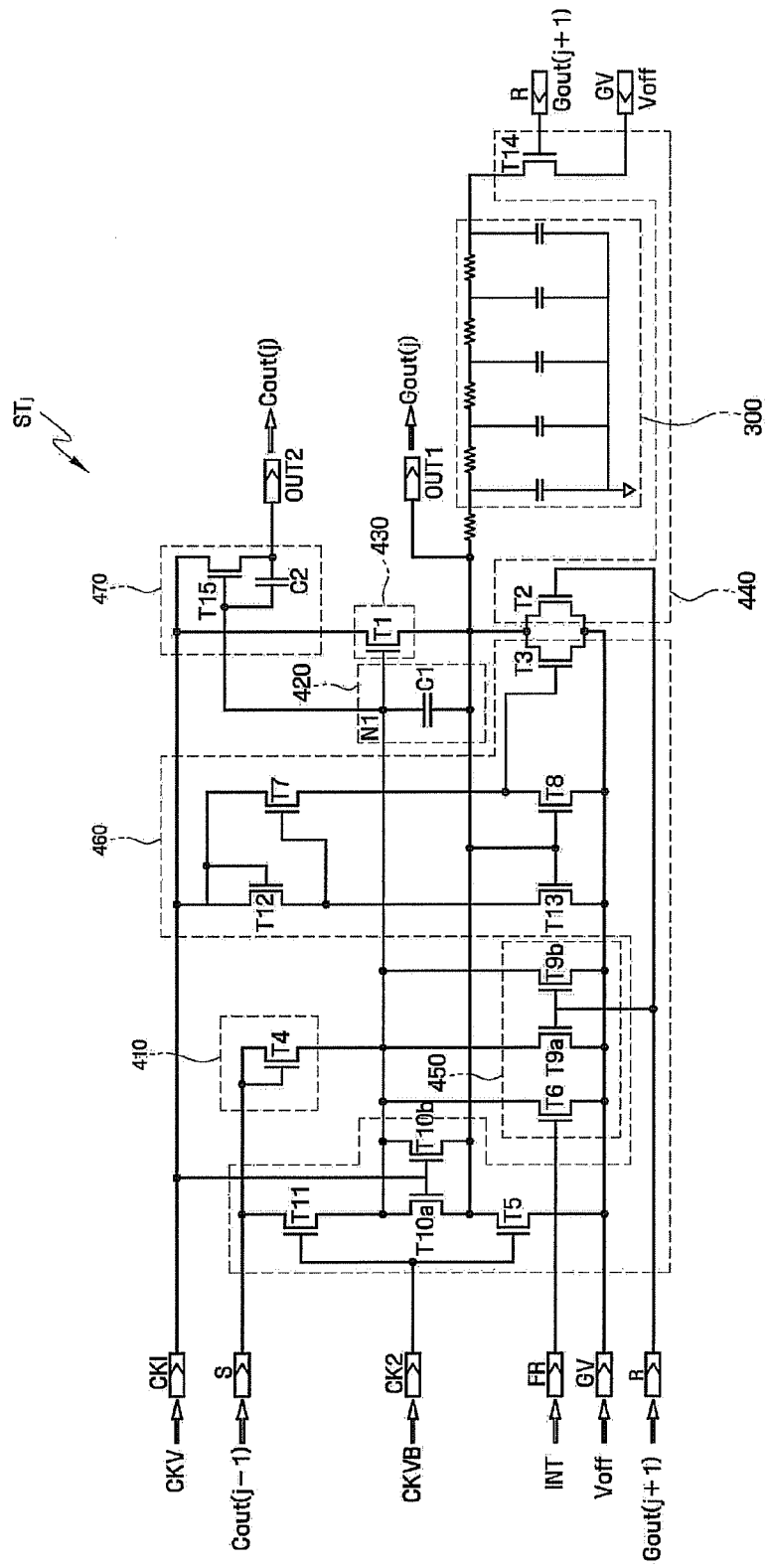
FIG. 3 is a circuit view of an exemplary embodiment of a jth stage shown in FIG. 2.
Figure 4:
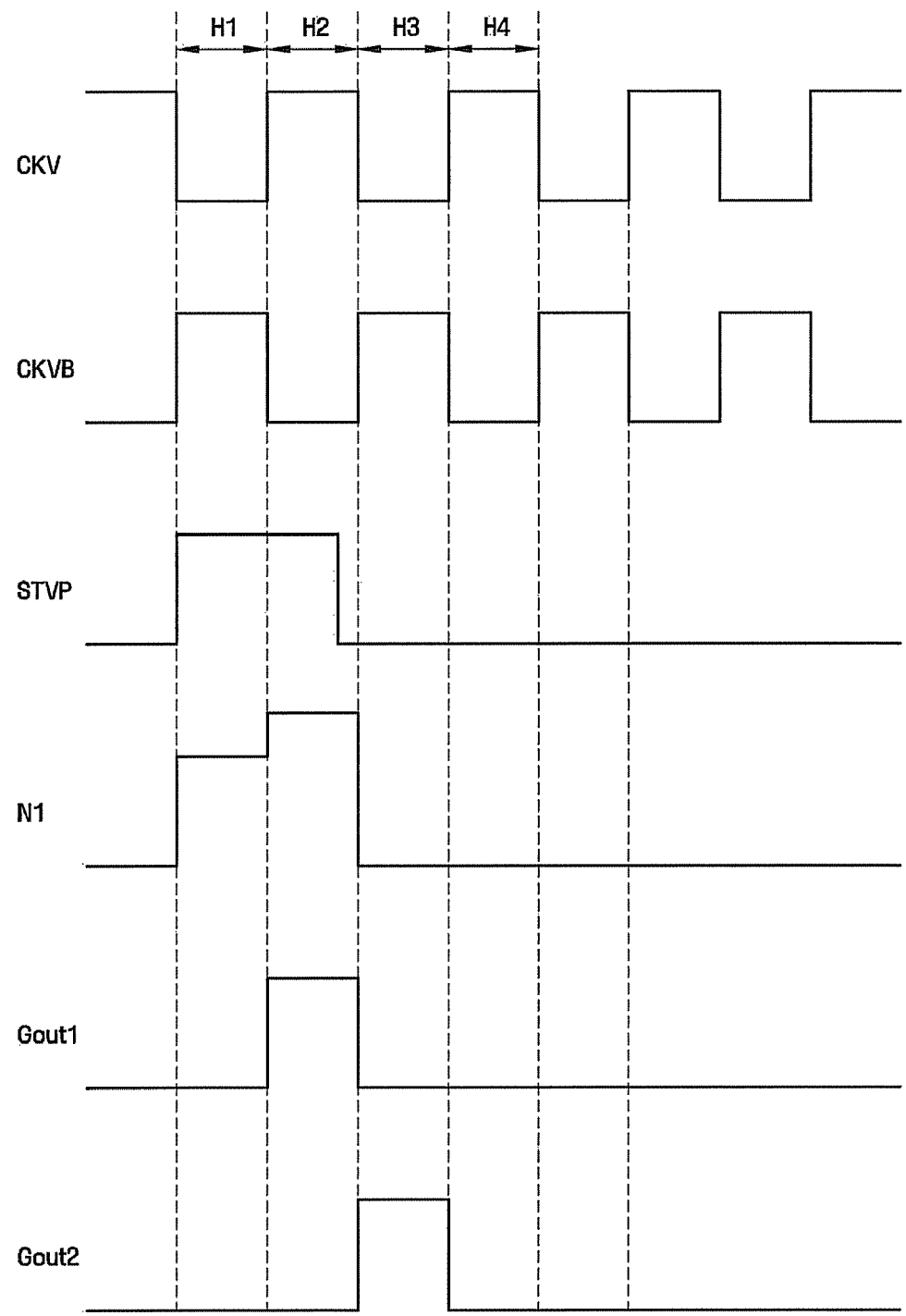
FIG. 4 is a signal diagram illustrating the operation of the jth stage shown in FIG. 3.

A display device according an exemplary embodiment of the present invention will be described with reference to FIGS. 1 through 4. FIG. 1 is a block diagram showing an exemplary display device according to an exemplary embodiment of the present invention, FIG. 2 is a block diagram showing an exemplary gate driver shown in FIG. 1, FIG. 3 is a circuit view of an exemplary embodiment of a jth stage shown in FIG. 2, and FIG. 4 is a signal diagram illustrating the operation of the jth stage shown in FIG. 3.

Referring first to FIG. 1, the display device according to an exemplary embodiment of the present invention includes a display panel 300, a signal supply unit 100, a gate driver 400, and a data driver 200. The signal supply unit 100 includes a timing controller 110 and a clock generator 120.

Referring again to FIG. 1, the display panel 300 may be divided into a display area DA in which an image is displayed and a peripheral area PA in which an image is not displayed.

The display area DA is an area on which an image is displayed, and the display area DA includes a first substrate (not shown) having first to nth gate lines $G_1$-$G_n$ (where n is an integer greater than 2), first to mth data lines $D_1$-$D_m$ (where m is an integer greater than 2), switching elements (not shown) and pixel electrodes (not shown), a second substrate (not shown) having color filters (not shown) and a common electrode (not shown), and a liquid crystal layer (not shown) interposed between the first and second substrates. The first to nth gate lines $G_1$-$G_n$ extend substantially in a transverse direction, a first direction, to be parallel to each other, and the first to mth data lines $D_1$-$D_m$ extend substantially in a longitudinal direction, a second direction substantially perpendicular to the first direction, to be parallel to each other.

The peripheral area PA is located at the outer portion of the display panel 300 which surrounds the display area DA and at which an image is not displayed.

The signal supply unit 100, including the timing controller 110 and the clock generator 120, receives input image signals R, G, and B and input control signals for controlling the display thereof from an external graphic controller (not shown), and outputs first image signals DAT and data control signals CONT to the data driver 200. In more detail, the timing controller 110 receives the input control signals including, for example, a vertical synchronizing signal $V_{sync}$, a horizontal synchronizing signal $H_{sync}$, a main clock $M_{clk}$, a data enable signal DE, etc., and outputs the data control signals CONT to the data driver 200. Here, the data control signals CONT for controlling the operation of the data driver 200 include, for example, a horizontal synchronizing start signal for starting the operation of the data driver 200, a load signal instructing to output two data voltages, etc.

Accordingly, the data driver 200 receives the first image signals DAT and the data control signals CONT, and applies image data voltages corresponding to the first image signals DAT to the data lines $D_1$-$D_m$. The data driver 200 generates data voltages including image data signals in predetermined units. The data driver 200 may be an integrated circuit ("IC") to be electrically connected to the display panel 300 in the form of a tape carrier package ("TCP"), but not limited thereto. The data driver 200 may be formed on the peripheral area PA of the display panel 300.

The signal supply unit 100 receives a vertical synchronizing signal $V_{sync}$, a main clock $M_{clk}$, etc., from an external graphic controller (not shown), receives a gate-on voltage Von and a gate-off voltage Voff from a voltage generator (not shown), and supplies the gate driver 400 with a first scanning start signal STVP, a first clock signal CKV, a second clock signal CKVB and a gate-off voltage Voff. In more detail, the timing controller 110 supplies a second scanning start signal STV, a first clock generation control signal OE, and a second clock generation control signal CPV to the clock generator 120. The clock generator 120 receives the second scanning start signal STV to then output the first scanning start signal STVP to the gate driver 400, and receives the first clock generation control signal OE and the second clock generation control signal CPV to then output the first clock signal CKV and the second clock signal CKVB to the gate driver 400. Here, the first clock signal CKV is an inverted signal of the second clock signal CKVB.

The gate driver 400, which is enabled by the first scanning start signal STVP, generates a plurality of gate signals using the first clock signal CKV, the second clock signal CKVB and the gate-off voltage Voff, and sequentially applies the respective gate signals to the first to nth gate lines $G_1$-$G_n$.

The gate driver 400 will be described in detail with reference to FIG. 2. The gate driver 400 includes a plurality of stages $ST_1$-$ST_{n+1}$, which are cascaded to one another. The stages $ST_1$-$ST_n$ except for the last stage $ST_{n+1}$ are connected to the gate lines $G_1$-$G_n$, and output gate signals $Gout_{(1)}$-$Gout_{(n)}$, respectively. The gate-off voltage Voff, the first clock signal CKV, the second clock signal CKVB and an initialization signal INT are inputted to the respective $ST_1$-$ST_{n+1}$. Here, the initialization signal INT is a signal for initializing a frame may be supplied from the clock generator 120, for example, a carry signal Cout(n+1) for the last stage $ST_{n+1}$.

Each of the stages $ST_1$-$ST_{n+1}$ includes first and second clock terminals CK1 and CK2, a set terminal S, a reset terminal R, a power voltage terminal GV, a frame reset terminal FR, a gate output terminal OUT1, and a carry output terminal OUT2.

For example, the set terminal S of a jth (j≠1) stage $ST_j$ connected to a jth gate line $G_j$ receives a carry signal Cout(j−1) of the previous stage $ST_{j-1}$, the reset terminal R receives a gate signal Gout(j+1) of the next stage $ST_{j+1}$, the first clock terminal CK1 and the second clock terminal CK2 receive a first clock signal CKV and a second clock signal CKVB, respectively, the power supply voltage terminal GV receives the gate-off voltage Voff, and the frame reset terminal FR receives the initialization signal INT or the carry signal Cout(n+1) of the last stage $ST_{n+1}$. The gate signal Gout(j) is outputted through the gate output terminal OUT1, and the carry signal Cout(j) is outputted through the carry output terminal OUT2.

The first scanning start signal STVP, instead of the carry signal of the previous stage, is inputted to the set terminal S of the first stage $ST_1$, and the first scanning start signal STVP, instead of the gate signal of the next stage, is inputted to the reset terminal R of the last stage $ST_{n+1}$.

In the gate output terminals OUT1 of the stages $ST_1$-$ST_n$, a high level of the first clock signal CKV supplied to the first clock terminal CK1 is outputted as the gate driving signal to the gate output terminal OUT1. That is to say, in odd-numbered stages $ST_1$, $ST_3$, ..., a high level of the first gate clock signal CKV is supplied to the first clock terminal CK1 and is outputted through the gate output terminal OUT1. In even-numbered stages $ST_2$, $ST_4$, ... of the gate output terminal OUT1, a high level of the second gate clock signal CKVB is outputted. Accordingly, the gate signals $Gout_{(1)}$-$Gout_{(n)}$ are sequentially outputted in the respective stages.

The jth stage $ST_j$ shown in FIG. 2 will be described in more detail with reference to FIGS. 3 and 4.

Referring first FIG. 3, the jth stage $ST_j$ includes a buffer unit 410, a charging unit 420, a pull-up unit 430, a carry signal generator 470, a pull-down unit 440, a discharging unit 450, and a holding unit 460. The jth stage $ST_j$ includes transistors, and the respective transistors T1-T14 may be amorphous silicon thin film transistors ("TFTs") or polysilicon TFTs.

The carry signal Cout(j−1)) of the previous stage, the first gate clock signal CKV, hereinafter referred to as the first clock signal CKV, and the second gate clock signal CKVB, hereinafter referred to as the second clock signal CKVB, are supplied to the jth stage $ST_j$. The first clock signal CKV includes holding periods H1 and H3 in which it is held at a low level, and shift periods H2 and H4 in which it is shifted from low level to high level and from high level to low level. Here, the shift period H2 or H4 means a period ranging from a rising edge to a falling edge.

First, the buffer unit 410 includes a transistor T4 with a gate electrode and a drain electrode connected commonly to the set terminal S and a source electrode connected to a first node N1. {Node "N1" is not identified in FIG. 3. FIG. 3 has been revised to change "Q_j" to "N1"—please advise if this revision is not correct.} [KASAN1]The buffer unit 410 supplies the carry signal Cout(j−1) of the previous stage inputted through the set terminal S to the charging unit 420, the carry signal generator 470 and the pull-up unit 430.

The charging unit 420 includes a capacitor C1 with a first end connected to the source of the transistor T4, the pull-up unit 430 and the discharging unit 450 and a second end connected to a gate output terminal OUT1.

The pull-up unit 430 includes a transistor T1, which has a drain electrode connected to the first clock terminal CK1, a gate electrode connected to the first node N1, and a source electrode connected to the gate output terminal OUT1.

The carry signal generator 470 includes a transistor T15 which has a drain electrode connected to the first clock terminal CK1, a source electrode connected to the carry output terminal OUT2, and a gate electrode connected to the buffer unit 410, and a capacitor C2 connected to the gate electrode and the source electrode of the transistor T15. When a potential of the first node N1 goes high, the carry signal generator 470 outputs a high level of the first clock signal CKV to the carry output terminal OUT2.

The pull-down unit 440 includes a polysilicon TFT TR, and lowers the gate signal Gout(j) to the gate-off voltage Voff. The first pull-down transistor T2 has a drain electrode connected to the source electrode of the transistor T1 and a second end of the capacitor C1, a source electrode connected to the power supply voltage terminal GV, and a gate electrode connected to the reset terminal R. The second pull-down transistor T14 has a source electrode connected to the power supply voltage terminal GV, a drain electrode connected to the jth gate line $G_j$ of the display panel 300, and a gate electrode connected to the reset terminal R.

The discharging unit 450 includes transistors T9a and T9b each having a gate electrode connected to the reset terminal R, a drain electrode connected to the first node N1, and a source electrode connected to the power supply voltage terminal GV, and discharging the charging unit 420 in response to the gate signal Gout(j+1) of the next stage $ST_{j+1}$. The discharging unit 450 also includes a transistor T6 having a gate electrode connected to the frame reset terminal FR, a drain electrode connected to the first node N1[KASAN2], and a source electrode connected to the power supply voltage terminal GV, and discharging the charging unit 420 in response to the initialization signal INT. {The capacitor C3 is not shown in FIG. 3, and therefore the drain electrode of the transistor T6 is described as connected to the first node N1 instead of capacitor C3—please advise if this correction is not accurate, or if FIG. 3 should be revised to include capacitor C3.}

The holding unit 460, which includes a plurality of transistors T3, T5, T7, T8, T10a, T10b, T11, T12, and T13, holds the gate signal Gout(j) at high level when the gate signal Gout(j) is shifted from low level to high level, and, after the gate signal Gout(j) is shifted from high level to low level, holds the voltage gate signal Gout(j) at low level during one frame irrespective of voltage levels of the first clock signal CKV and the second clock signal CKVB.

Operations of the respective units described above will now be described in detail with reference to FIGS. 3 and 4.

First, a process of the gate signal Gout(j)) being shifted from the gate-off voltage Voff to the gate-on voltage Von will be described.

The charging unit 420 is supplied with the carry signal Cout(j−1) of the previous stage and is charged. In the first holding period H1, for example, the charging unit 420 is supplied with the carry signal Gout(j−1) of the previous stage and is charged, and a voltage of the first node N1 slowly increases. If the first clock signal CKV that is shifted from low level to high level is inputted in the first shift period H2, the voltage of the first node N1 is boosted again by the transistor T1 and a parasitic capacitor (not shown) of the first node N1.

The voltage of the charging unit 420, that is, the voltage of the first node N1, is boosted to a first charging level, e.g., a positive voltage, as shown in FIG. 4, (the transistor T1 of the pull-up unit 430 is turned ON), the first clock signal CKV inputted through the first clock terminal CK1 is supplied as the gate signal Gout(j) through the gate output terminal OUT1. That is to say, the gate signal Gout(j) is shifted to a level of the gate-on voltage Von. In addition, the transistor T15 of the carry signal generator 470 is turned ON to output the first clock signal CKV as the carry signal Cout(j) through the carry output terminal OUT2.

Next, a process of the gate signal Gout(j) being shifted from the gate-on voltage Von to the gate-off voltage Voff will be described.

When the first clock signal CKV is shifted from high level to low level in the first shift period H2, the voltage of the first node N1 is lowered by the parasitic capacitor (not shown). Here, as the gate signal Gout(j+1) of the next stage goes high, transistors T9a and T9b of the discharging unit 450 are turned ON to supply the first node N1 with the gate-off voltage Voff. Accordingly, the voltage of the first node N1 is lowered to a level of the gate-off voltage Voff. That is to say, when the gate signal Gout(j+1) of the next stage goes high, the transistor T1 of the pull-up unit 430 is not turned OFF and outputs the first clock signal CKV held in low level as the gate signal Gout(j). In addition, when the gate signal Gout(j+1) of the next stage goes high, the polysilicon TFT TR of the pull-down unit 440 supplies the gate line with the gate-off voltage Voff. Since the pull-down unit 440 lowers the gate signal Gout(j) to the level of the gate-off voltage Voff and the pull-up unit 430 supplies the first clock signal CKV held at low level as the gate signal Gout(j), the voltage level of the gate signal Gout(j) is rapidly pulled down to the level of the gate-off voltage Voff. Accordingly, the gate signal Gout(j) is not overlapped with the gate signal Gout(j+1) of the next stage.

Next, a process of holding the level of the gate signal Gout(j) at the level of the gate-off voltage Voff during one frame after the gate signal Gout(j) is pulled down to the gate-off voltage Voff will be described.

When the gate signal Gout(j) is pulled down to the level of the gate-off voltage Voff, transistors T8 and T13 are turned ON. The transistor T13 turns the transistor T7 OFF to prevent the first clock signal CKV held at high level from being supplied to the transistor T3, and the transistor T8 turns the transistor T3 OFF. Accordingly, the gate signal Gout(j) is held at high level.

After the gate signal Gout(j) is shifted from high level to low level, the transistors T8 and T13 are turned OFF. When the first clock signal CKV is in a high level, the transistors T7 and T12 turn the transistor T3 ON, thereby holding the gate signal Gout(j) at low level. The transistors T10a and T10b are turned ON to hold the gate electrode of the transistor T1 at low level. Accordingly, the first clock signal CKV being in high level is not outputted to the gate output terminal OUT1. If the second clock signal CKVB is shifted to high level, the transistors T5 and T11 are turned ON[KASAN3]. {please advise if this revision from "OFF" to "ON" is not correct.} The turned-ON transistor T5 holds the gate signal Gout(j) at low level, and the turned-ON transistor T11 holds a first end of the capacitor C1 at low level. Thus, the gate signal Gout(j) is held at low level during one frame.

In an alternative exemplary embodiment, the jth stage $St_j$ may not include the carry signal generator 470. In such a case, the jth stage $St_j$ may operate by inputting the gate signal Gout(j−1) of the previous stage $ST_{j-}$, instead of the carry signal Gout(j−1) of the previous stage ST(j−1), through the set terminal S.

Figure 5:
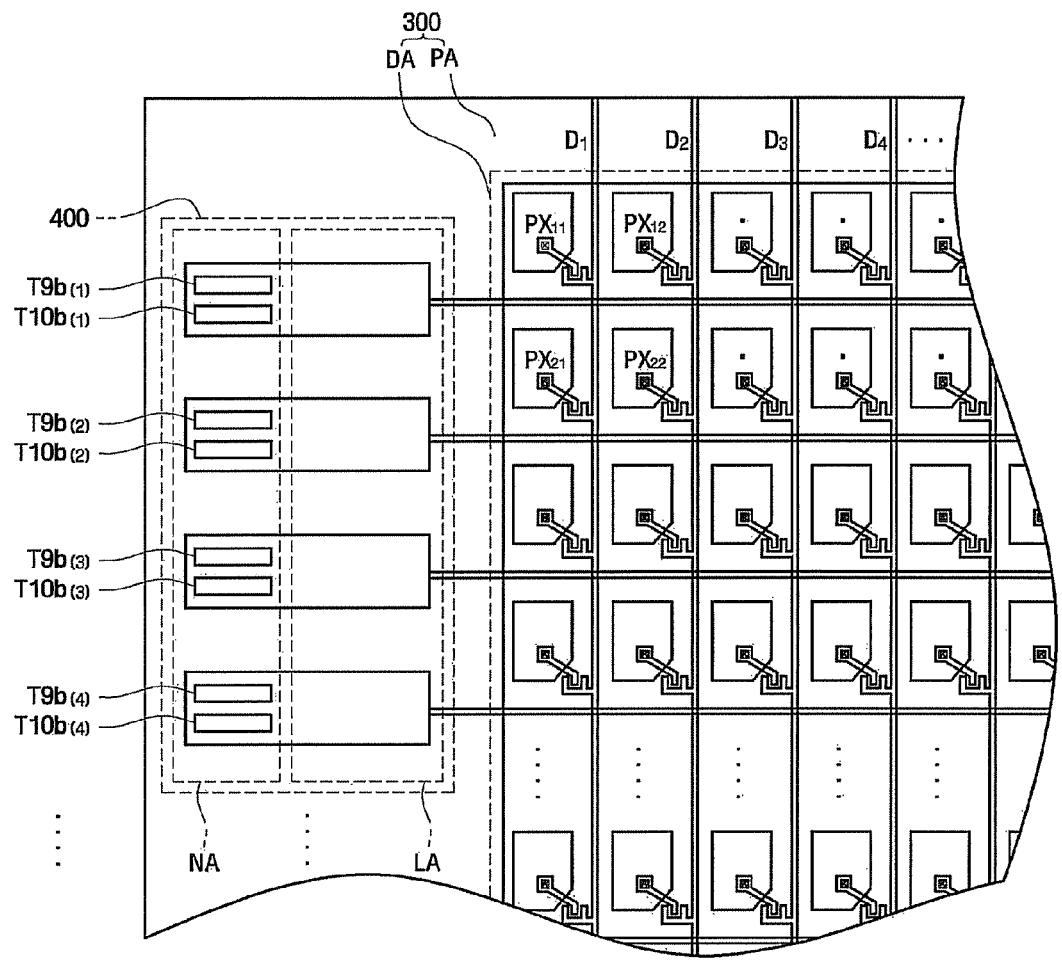
FIG. 5 is a layout view of an exemplary display panel included in the exemplary display device shown in FIG. 1.
Figure 6:
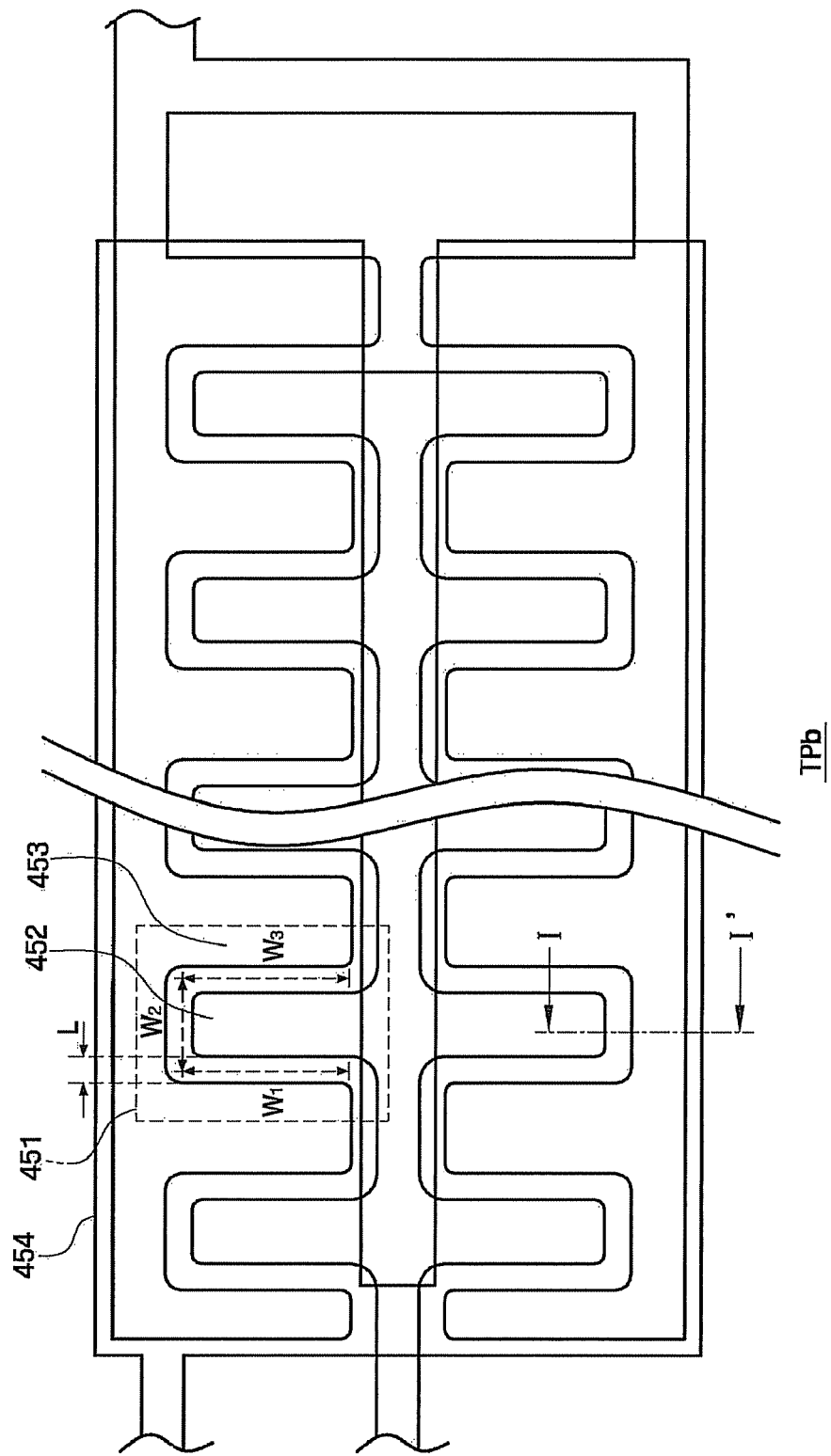
FIG. 6 is a layout view of an exemplary polycrystalline thin film transistor ("TFT") included in the exemplary display panel shown in FIG. 5.
Figure 7:
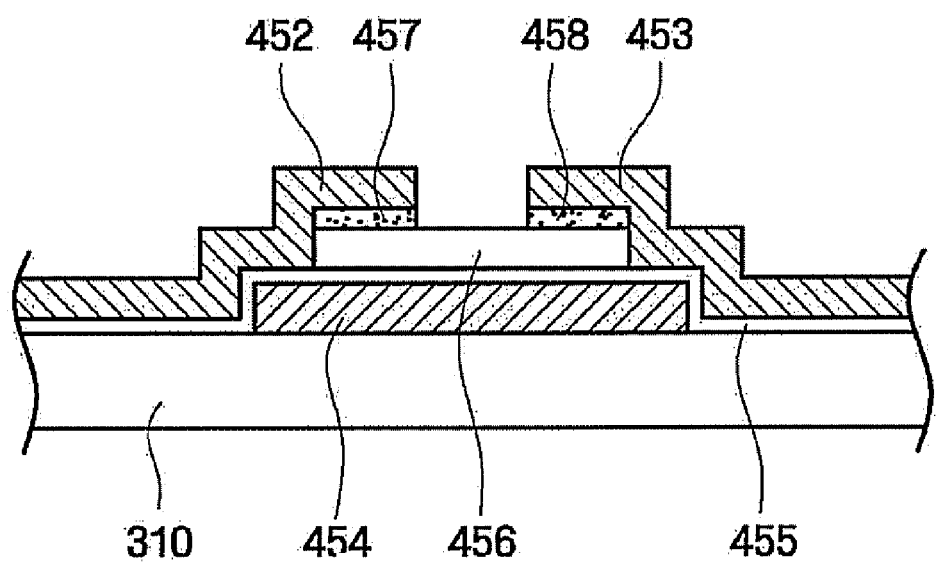
FIG. 7 is a cross-sectional view of the exemplary polycrystalline TFT taken along line I-I' in FIG. 6.

Hereinafter, the display panel will be described in detail with reference to FIG. 3 and FIGS. 5 through 7. FIG. 5 is a layout view of an exemplary display panel included in the exemplary display device shown in FIG. 1, FIG. 6 is a layout view of an exemplary polycrystalline TFT included in the exemplary display panel shown in FIG. 5, and FIG. 7 is a cross-sectional view of the exemplary polycrystalline TFT taken along line I-I' in FIG. 6.

As described above, the display panel 300 includes a display area DA in which an image is displayed and a peripheral area PA in which no image is displayed. In the DA, a plurality of pixels $PX_{11}$-$PX_{mn}$ are arranged in a matrix form, and the respective pixels $PX_{11}$-$PX_{mn}$ are controlled by a switching element formed by amorphous TFTs. Amorphous TFTs made of amorphous silicon ("a-Si") are used as the TFTs controlling the respective pixels $PX_{11}$-$PX_{mn}$. The amorphous TFTs are advantageously used to control the pixels $PX_{11}$-$PX_{mn}$ because they exhibit little leakage of current.

The peripheral area PA surrounding the display area DA is a non-display area in which an image is not displayed, and on which the gate driver 400 is mounted. As described above, the gate driver 400 includes a plurality of stages $ST_1$-$ST_n$, which are cascaded to one another.

Meanwhile, the peripheral area PA is divided into a first area (NA) and a second area (LA). The first area NA is an area in which circuits including amorphous silicon TFTs are formed, and the second area LA is an area in which circuits including polysilicon TFTs are formed.

In addition, the gate driver 400 may include both the first area NA and the second area LA. In other words, in order to achieve high integration and highly functional switching elements, polysilicon TFTs may be used. In order to prevent leakage of current and deterioration due to the prolonged use, amorphous silicon TFTs may be used. Accordingly, amorphous silicon TFTs are arranged in the first area NA, and polysilicon TFTs are arranged in the second area LA.

In order to form both the first area NA including amorphous silicon TFTs and the second area LA including polysilicon TFTs on the display panel 300, partial annealing may be performed using laser. In other words, amorphous silicon TFTs are used as TFTs included in the first area NA and the second area LA, and laser is partially irradiated onto only the second area LA. In such a manner, the amorphous silicon TFTs in the second area LA can be converted into polysilicon TFTs, while the amorphous silicon TFTs in the first area NA remain amorphous silicon TFTs. Here, the converted polysilicon TFTs may have mobility of about 2 to about 10 $cm^2$/Vs. The mobility of a polysilicon TFT may be about 4 to about 10 times that of an amorphous silicon TFT.

In particular, some of the TFTs T9a, T9b, T10a, and T10b constituting the discharging unit 450 and the holding unit 460 of the gate driver 400 may be formed on the first area NA, and the rest of the transistors may be formed on the second area LA. In more detail, among the transistors constituting the discharging unit 450, the TFTs T9a and T9b are cascaded to each other with one of these transistors formed on the first area NA and the other formed on the second area LA, each of the TFTs T9a and T9b having a gate electrode to which the gate signal Gout(j−1) of the previous stage is inputted, a drain electrode to which the first node N1 is connected and a source electrode to which the gate-off voltage Voff is applied. In other words, the amorphous silicon TFT T9b may be formed on the first area NA, and the polysilicon TFT T9a may be formed on the second area LA.

In addition, among the transistors constituting the holding unit 460, the TFTs T10a and T10b are cascaded to each other with one of these transistors formed on the first area NA and the other formed on the second area $LA_1$, each of the TFTs T10a and T10b having a gate electrode to which the first clock signal is inputted, a drain electrode to which the first node N1 is connected and a source electrode to which the gate lines $G_1$-$G_n$ are connected. In other words, the amorphous silicon TFT T10b may be formed on the first area NA, and the polysilicon TFT T10a may be formed on the second area $LA_1$.

As described above, the polysilicon TFTs T9a and T10a and the amorphous silicon TFTs T9b and T10b are cascaded to constitute the holding unit 460 and the discharging unit 450, thereby preventing malfunction or inferiority due to leakage of current and improving driving capability compared to a case where only the amorphous silicon TFTs are used.

The cascaded structure of the polysilicon TFTs and the amorphous silicon TFTs may be applied to the pull-up unit 430, the pull-down unit 440, etc., as well as the holding unit 460 or the discharging unit 450.

The structure of the polycrystalline TFT will now be described in more detail with reference to FIGS. 6 and 7. The polycrystalline TFT TR shown in FIGS. 6 and 7 is an exemplary TFT employed in the gate driver 400.

The polysilicon TFT TR includes a source electrode 453 and a drain electrode 452 facing the source electrode 453. The source electrode 453 and the drain electrode 452 are spaced apart from each other by a predetermined gap in which a channel is formed. In order to increase a channel width (W), the source electrode 453 and the drain electrode 452 have a concave-convex shape ( ). In addition, the source electrode 453 and the drain electrode 452 may have a plurality of concave-convex units 451 repeatedly formed in order to maximize the channel width W. In other words, the source electrode 453 and the drain electrode 452 may each have a comb shape, and teeth of the source electrode 453 may be nested between teeth of the drain electrode 452.

A channel means a passageway formed between the source electrode 453 and the drain electrode 452 to allow charges to move according to the gate signal Gout(j) applied to the gate electrode 454. Here, a channel length (L) is a length between the source electrode 453 and the drain electrode 452 in a perpendicular direction. The channel width W is an overall width of a centerline of the channel extending parallel with the source electrode 453 and the drain electrode 452.

In each of the plurality of concave-convex units 451, a channel width (W1/n) is the sum, i.e., W1+W2+W3, of widths of channels formed along the outer unit of the source electrode 453. In other words, the channel width W is equal to a value (W=W1/n×n) which results after multiplying the channel width W1/n (i.e., W1+W2+W3) of each of the plurality of concave-convex units 451 with a number (n) of the concave-convex units 451. Like in the polysilicon TFT, in the TFT including the plurality of concave-convex units 451, an important factor in determining the transistor performance is a ratio of the channel width W to the channel length L, that is, W/L.

Hereinafter, the structure of the polysilicon TFT TR will be described in detail.

A gate electrode 454 is formed on an insulating substrate 310 made of, for example, transparent glass. The gate electrode 454 may be made of an aluminum (Al) containing metal such as Al and Al alloy, a silver (Ag) containing metal such as Ag and Ag alloy, a copper (Cu) containing metal such as Cu and Cu alloy, a molybdenum (Mo) containing metal such as Mo and Mo alloy, chromium (Cr), titanium (Ti) or tantalum (Ta). In addition, the gate electrode 454 may have a multi-layered structure including two conductive films (not shown) having different physical characteristics.

A gate insulating layer 455 preferably made of silicon nitride (SiNx) is formed on the gate electrode 454.

A semiconductor layer 456 preferably made of polysilicon is formed on the gate insulating layer 455. Alternatively, the semiconductor layer 456 may be made of hydrogenated amorphous silicon, and then converted into polysilicon by irradiating laser. Ohmic contact layers 457 and 458 preferably made of silicide or n+ hydrogenated amorphous silicon heavily doped with n type impurity are formed on the semiconductor layer 456. The ohmic contact layers 457 and 458 are located above the semiconductor layer 456 in pair.

The source electrode 453 and the drain electrode 452 are formed on the ohmic contact layers 457 and 458 and the gate insulating layer 455. Each of the source electrode 453 and the drain electrode 452 has at least a portion overlapping the semiconductor layer 456.

Figure 8:
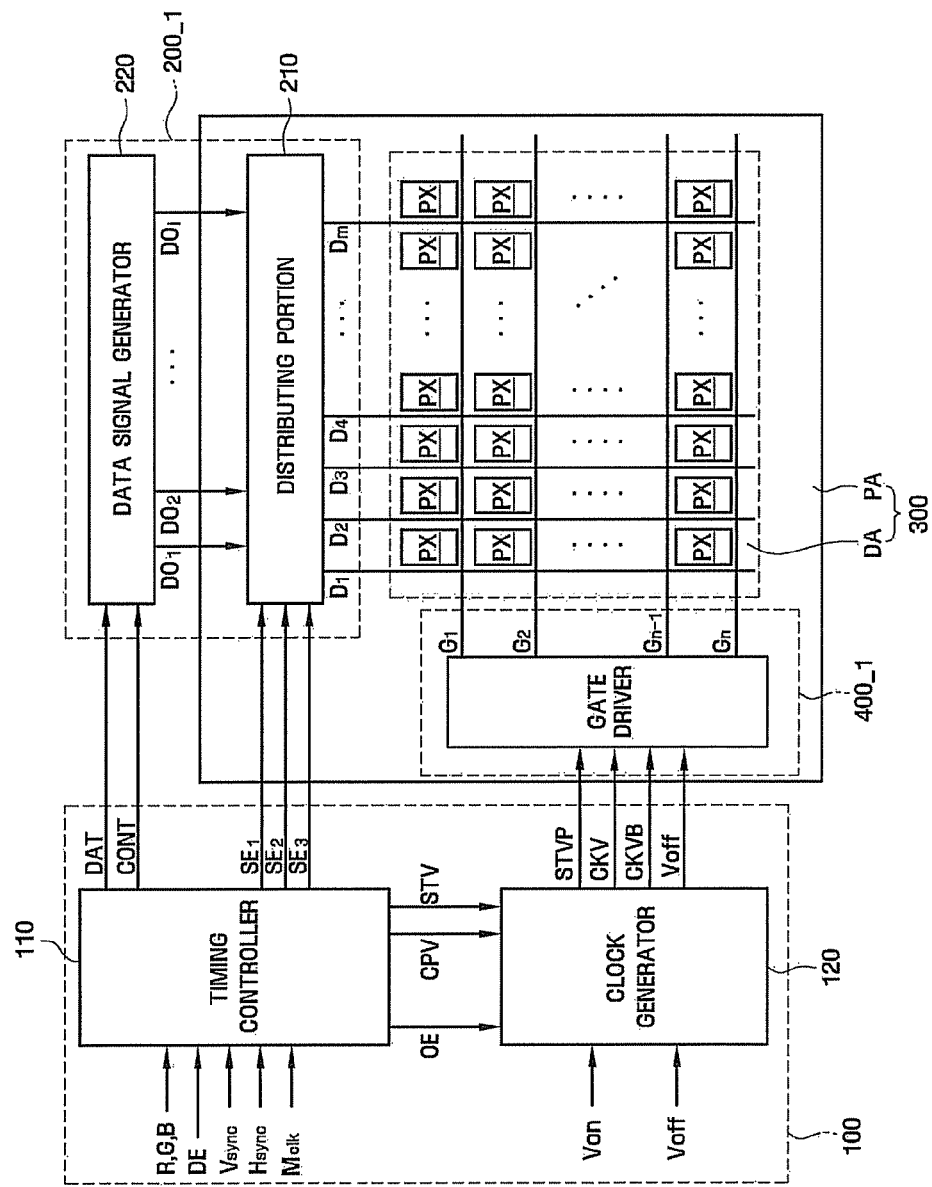
FIG. 8 is a block diagram showing an exemplary display device according to another embodiment of the present invention.
Figure 9:
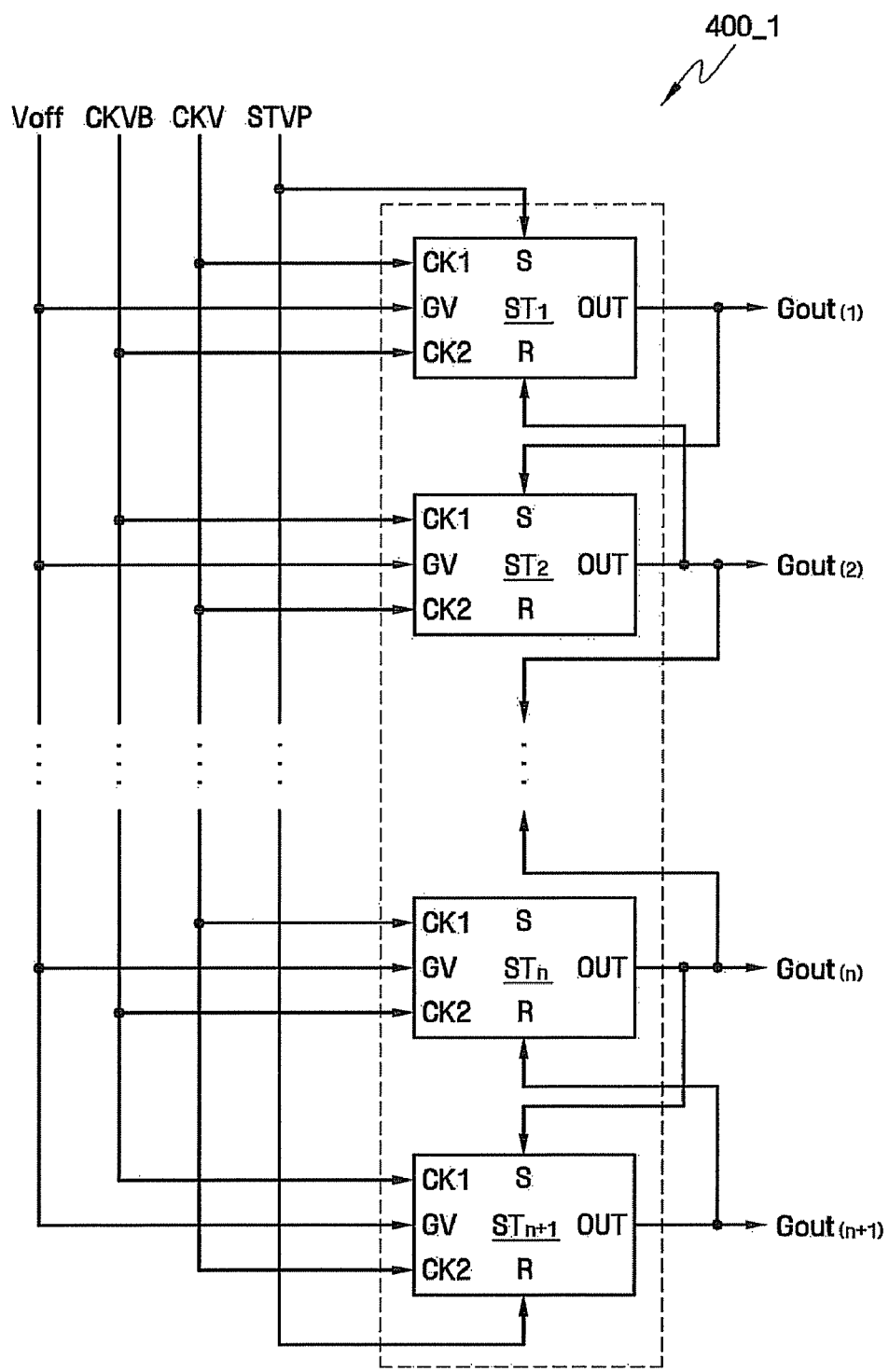
FIG. 9 is a block diagram showing an exemplary gate driver shown in FIG. 8.
Figure 10:
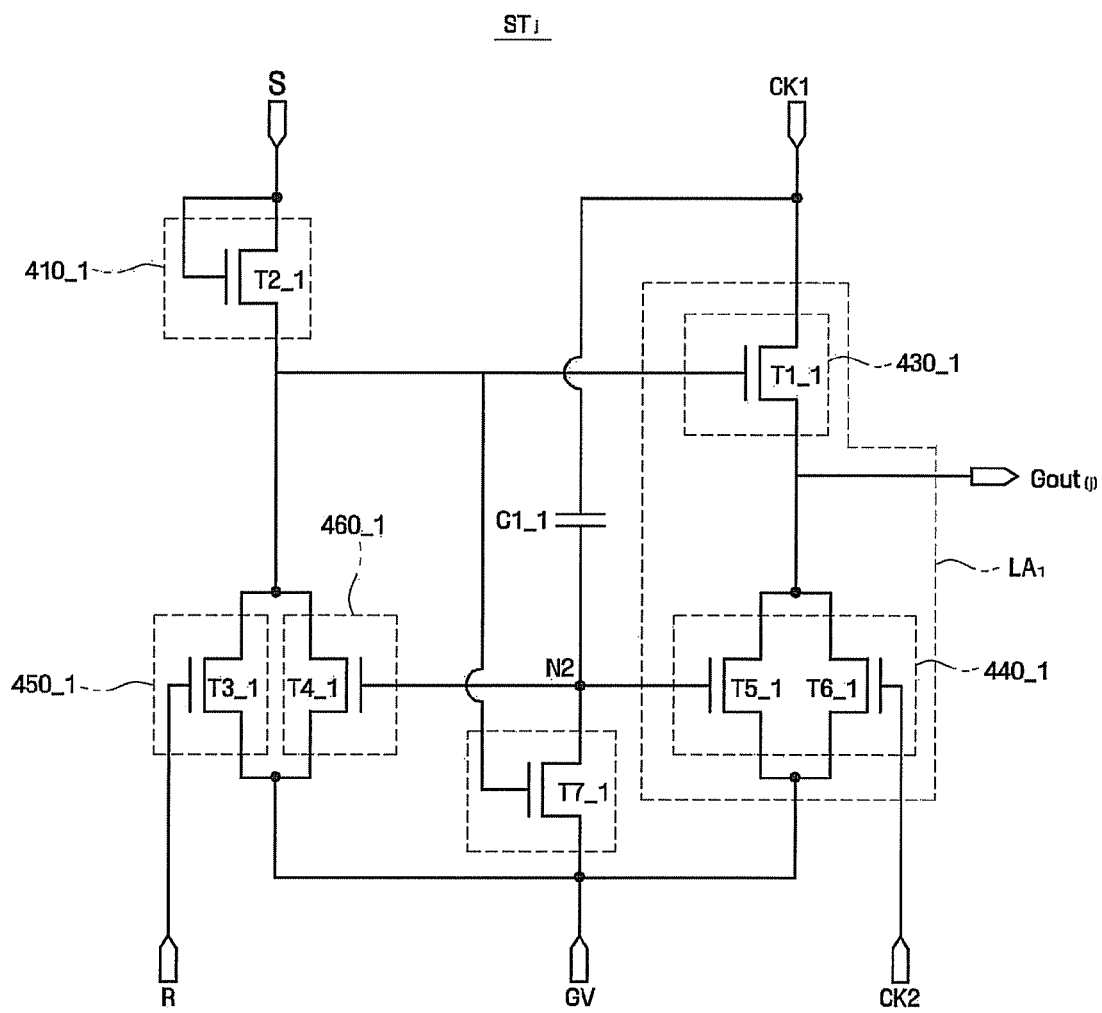
FIG. 10 is a circuit view of an exemplary embodiment of a jth stage shown in FIG. 9.
Figure 11:
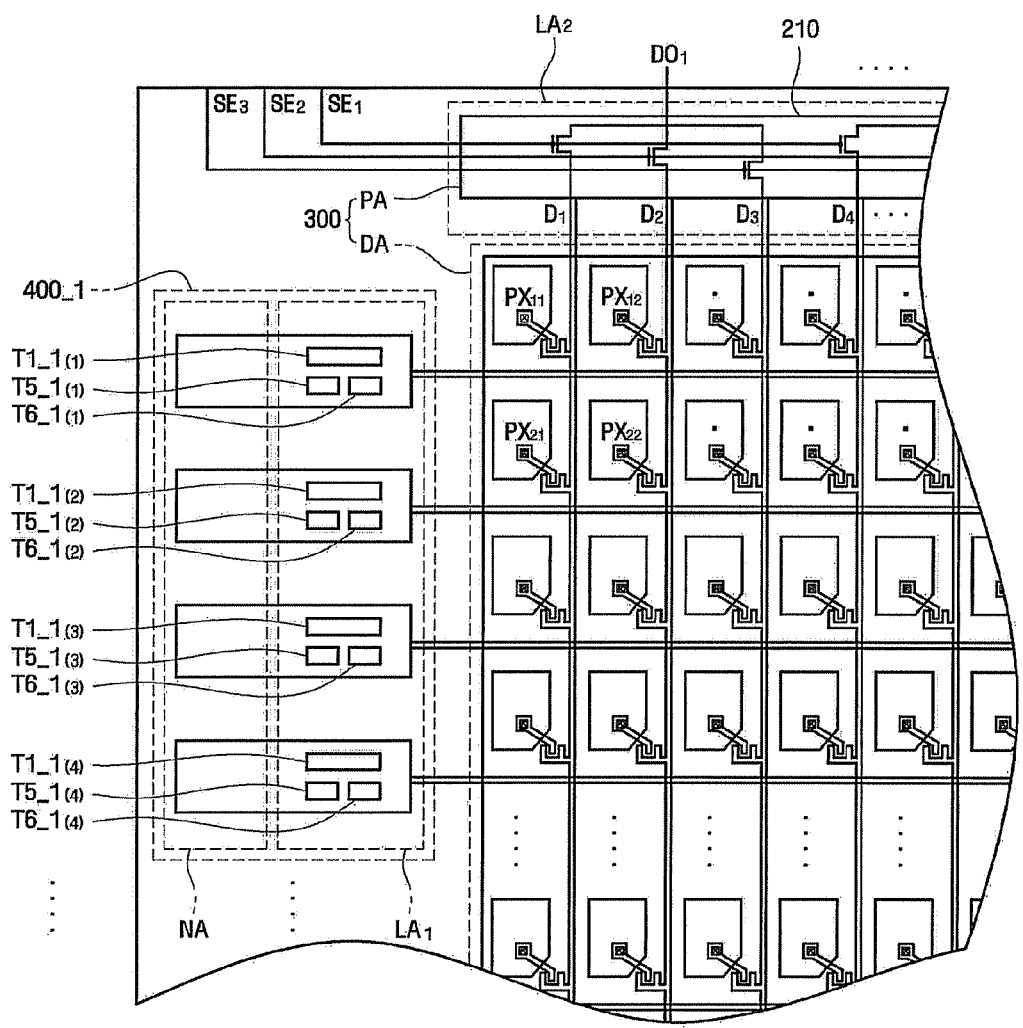
FIG. 11 is a layout view of an exemplary display panel included in the exemplary display device shown in FIG. 8.

Hereinafter, a gate driver and a display device according to another exemplary embodiment of the present invention will be described with reference to FIGS. 8 through 11. FIG. 8 is a block diagram showing an exemplary display device according to another exemplary embodiment of the present invention, FIG. 9 is a block diagram showing an exemplary gate driver shown in FIG. 9, FIG. 10 is a circuit view of an exemplary embodiment of a jth stage shown in FIG. 9, and FIG. 11 is a layout view of an exemplary display panel included in the exemplary display device shown in FIG. 8.

For convenience of description, the same reference numerals in the respective drawings refer to elements having similar structure and function.

Referring first to FIG. 8, the display device according to another exemplary embodiment of the present invention includes a data signal generator 220 and a distributing portion or unit 210. In detail, a data driving unit 200_1 receives first image signals DAT and data control signals CONT, and supplies image data voltages corresponding to the first image signals DAT to the respective data lines $D_1$-$D_m$. The data driving unit 200_1 includes a data signal generator or generating unit 220 and a distributing portion or unit 210. Here, the distributing unit 210 serves a demultiplexer ("demux"), and includes input terminals to which second image signals $DO_1$-$DO_i$ are applied and output terminals connected to the respective data lines $D_1$-$D_m$. The output terminals may be connected to the respective data lines $D_1$-$D_m$ one by one, and each one input terminal may be connected to every three among the data lines $D_1$-$D_m$.

As described above, the data driving unit 200_1 is divided into the data signal generating unit 220 and the distributing unit 210 to be partially mounted into the display panel 300. That is to say, the distributing unit 210 is mounted into the display panel 300 to distribute functions of the data driving unit 200_1, thereby decreasing the number of connecting wires between the display panel 300 and an external printed circuit board ("PCB" not shown).

Referring to FIG. 9, a gate driving unit 400_1 includes a plurality of stages $ST_1$-$ST_{n+1}$, which are cascaded to one another. The stages $ST_1$-$ST_n$ except for the last stage $ST_{n+1}$ are connected to gate lines ($G_1$-$G_n$ shown in FIG. 1) in a one-to-one relationship, and output gate signals $Gout_{(1)}$-$Gout_{(n)}$, respectively.

Each of the stages $ST_1$-$ST_{n+1}$ has a first clock terminal CK1, a second clock terminal CK2, a set terminal S, a reset terminal R, a power supply voltage terminal GV, and a gate output terminal OUT.

In odd-numbered stages $ST_1$, $ST_3$, . . . of the gate driving unit 400_1, a first clock signal CKV is applied to the first clock terminal CK1, and a second clock signal CKVB is applied to the second clock terminal CK2. Here, the first clock signal CKV and the second clock signal CKVB have phases opposite to each other. Meanwhile, in even-numbered stages $ST_2$, $ST_4$, . . . of the gate driving unit 400_1, a second clock signal CKVB is applied to the first clock terminal CK1, and a first clock signal CKV is applied to the second clock terminal CK2.

A first scanning start signal STVP or the gate signal $Gout_{(j+1)}$ of the next stage $ST_{j+1}$ is applied to the set terminal S of the jth stage $ST_j$, and the gate signal $Gout_{(j+1)}$ of the next stage $ST_{j+1}$ is applied to the reset terminal R.

An exemplary stage STj of the gate driving unit 400_1 will be described in detail with reference to FIG. 10. The stage STj includes a pull-up unit 430_1, a pull-down unit 440_1, a buffer unit 410_1, a holding unit 460_1, and a discharging unit 450_1.

The pull-up unit 430_1 includes a transistor T1_1 with a drain electrode to which the first clock signal CKV is inputted and a source electrode from which the gate signal Gout(j) is outputted, and a gate electrode connected to a source electrode of a transistor of the buffer unit 410_1[KASAN4]. {Please note that since the node N1 is not shown in FIG. 10, the gate electrode of transistor T1_1 is described as connected to a source electrode of a transistor of the buffer unit 410_1. Please advise if node N1 should be added to FIG. 10 instead. Also, please note that the phrase "and a source electrode to which a scanning start signal STVP or the gate signal Gout (j−1) of the previous stage are inputted" has been removed from the description of transistor T1_1.}

The pull-down unit 440_1 includes a transistor T6_1 with a source electrode to which a gate-off voltage Voff is applied, a drain electrode to which the gate signal Gout(j+1) is inputted, and a gate electrode to which the second clock signal CKVB is inputted. The pull-down unit 440_1 also includes a transistor T5_1 with a source electrode to which the gate-off voltage Voff is applied, a drain electrode to which the gate signal Gout(j+1) is inputted, and a gate electrode connected to the drain electrode of a transistor T7_1[KASAN5]. {It is noted that transistor T7_1 is not shown within the dashed lines for the holding unit 460_1. Please advise if the holding unit 460_1 should include the transistor T7_1, or if the unit encircled by the dashed lines surrounding transistor T7_1 should be separately identified.}

The buffer unit 410_1 includes a transistor T2_1 with a gate electrode and a drain electrode connected commonly to the set terminal S and a source electrode connected to the gate electrode of the transistor T1_1 of the pull-up unit 430_1.

The discharging unit 450_1 includes a transistor T3_1 with a gate electrode connected to a reset terminal R, a drain electrode connected to the gate electrode of the transistor T1_1 of the pull-up unit 430_1, and a source electrode to which the gate-off voltage Voff is applied.

The holding unit 460_1 includes a transistor T4_1 with a drain electrode connected to the pull-up unit 430_1, a source electrode to which the gate-off voltage Voff is applied, and a gate electrode connected to the transistor T7_1 of the holding unit 460_1, thereby preventing ripples.

Referring to FIGS. 10 and 11, a display panel 300 is divided into a display area DA in which an image is displayed and a peripheral area PA in which an image is not displayed. In the display area DA, a plurality of pixels $PX_{11}$-$PX_{mn}$ are arranged in a matrix form, and the respective pixels $PX_{11}$-$PX_{mn}$ are controlled by a switching element formed by amorphous TFTs. Amorphous TFTs made of amorphous silicon are used as the TFTs controlling the respective pixels $PX_{11}$-$PX_{mn}$. The amorphous TFTs are advantageously used to control the pixels $PX_{11}$-$PX_{mn}$ because they exhibit little leakage of current.

The peripheral area PA surrounding the display area DA is a non-display area in which an image is not displayed, and on which the gate driving unit 400_1 is mounted. As described above, the gate driving unit 400_1 includes a plurality of stages $ST_1$-$ST_n$, which are cascaded to one another.

Meanwhile, the peripheral area PA is divided into a first area NA and second areas $LA_1$ and $LA_2$. The first area NA is an area in which circuits including amorphous silicon TFTs are formed, and the second areas $LA_1$ and $LA_2$ are areas in which circuits including polysilicon TFTs are formed.

The TFTs included in the distributing unit 210 may be provided on the second area $LA_2$. That is to say, a TFT serving as a switching element for controlling the distributing unit 210 is preferably formed by a polycrystalline TFT having an excellent mobility characteristic. Accordingly, some or all of TFTs constituting the distributing unit 210 may be provided on the second area $LA_2$.

In addition, the gate driving unit 400_1 may include both the first area NA and the second area $LA_1$. In other words, in order to achieve high integration and highly functional switching elements, polysilicon TFTs may be used. In order to prevent leakage of current and deterioration due to the prolonged use, amorphous silicon TFTs may be used. Accordingly, amorphous silicon TFTs are arranged in the first area NA, and polysilicon TFTs are arranged in the second area $LA_1$.

In order to form both the first area NA including amorphous silicon TFTs and the second area $LA_1$ including polysilicon TFTs on the display panel 300, partial annealing may be performed using laser. In other words, amorphous silicon TFTs are used as TFTs included in the first area NA and the second area $LA_1$, and laser is partially irradiated onto only the second area $LA_1$. That is to say, all of the TFTs in the first area NA and the second areas $LA_1$ and $LA_2$ are formed by amorphous silicon TFTs, and laser is partially irradiated onto only the second areas $LA_1$ and $LA_2$. Here, the converted polysilicon TFTs may have mobility of about 2 to about 10 $cm^2$/Vs. The mobility of a polysilicon TFT may be about 4 to about 10 times that of an amorphous silicon TFT.

The TFT T1_1 and the TFTs T5_1 and T6_1 constituting the pull-up unit 430_1 and the pull-down unit 440_1 of the gate driving unit 400_1 may be formed on the second area $LA_1$. In detail, the respective transistors T1_1 to T7_1 constituting the gate driving unit 400_1 may be formed by amorphous silicon TFTs or polycrystalline TFTs. For example, polysilicon TFTs may be used as TFTs connected to output terminals in order to increase driving capability and to prevent leakage of current. In other words, the TFT T1_1 and the TFTs T5_1 and T6_1 constituting the pull-up unit 430_1 and the pull-down unit 440_1 may be formed by polysilicon TFTs in the second area $LA_1$. The rest of the transistors T2_1, T3_1, T4_1 and T7_1 may be formed by amorphous silicon TFTs in the first area NA. As described above, the gate driving circuit having both improved driving capability and reliability can be achieved by forming the gate driving unit 400_1 using combinations of amorphous silicon TFTs and polysilicon TFTs. Some transistors T1_1, T5_1 and T6_1 of the gate driving unit 400_1 can be formed by polysilicon transistors using the above-described partial laser annealing method.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A gate driving circuit comprising a shift register having a plurality of stages cascaded to one another, each of the plurality of stages including
a pull-up unit outputting a first clock signal as a gate signal in response to a signal of a first node to which a first input signal is applied;
a pull-down unit discharging the gate signal to a level of a gate-off voltage if a second input signal is inputted;
a discharging unit discharging a signal of the first node in response to the second input signal to the level of gate-off voltage; and
a holding unit holding the signal of the first node in response to the first clock signal at a level of the gate signal discharged to the level of the gate-off voltage,
wherein at least one of the discharging unit and the holding unit includes an amorphous silicon thin film transistor and a polysilicon thin film transistor connected in parallel to each other, and
wherein the amorphous silicon thin film transistor and the polysilicon thin film transistor are configured to operate simultaneously.

2. The gate driving circuit of claim 1, wherein the discharging unit has an amorphous silicon thin film transistor and a polysilicon thin film transistor, and each of the amorphous silicon thin film transistor and the polysilicon thin film transistor of the discharging unit has a gate electrode to which the second input signal is inputted, a drain electrode connected to the first node, and a source electrode to which the gate-off voltage is applied.

3. The gate driving circuit of claim 1, wherein the holding unit has an amorphous silicon thin film transistor and a polysilicon thin film transistor, and each of the amorphous silicon thin film transistor and the polysilicon thin film transistor of the holding unit has a gate electrode to which the first clock signal is inputted, a drain electrode connected to the first node, and a source electrode connected to a gate line.

4. The gate driving circuit of claim 1, comprising a first area in which the amorphous silicon thin film transistor is formed and a second area in which the polysilicon thin film transistor is formed, wherein the first area and the second area are sectioned.

5. The gate driving circuit of claim 4, wherein the second area is annealed by laser.

6. The gate driving circuit of claim 1, wherein each of the amorphous silicon thin film transistor and the polysilicon thin film transistor has a gate electrode disposed below a source electrode and a drain electrode.

7. The gate driving circuit of claim 1, wherein mobility of the polysilicon thin film transistor is about 4 to about 10 times that of the amorphous silicon thin film transistor.

8. The gate driving circuit of claim 1, wherein the polysilicon thin film transistor has mobility of about 2 to about 10 $cm^2/Vs$.

9. The gate driving circuit of claim 1, wherein the polysilicon thin film transistor is formed by performing laser annealing on an amorphous silicon thin film transistor.

10. The gate driving circuit of claim 1, wherein the first clock signal and a second clock signal have phases opposite to each other.

11. The gate driving circuit of claim 1, wherein the first input signal is a scanning start signal or a gate signal of a previous stage, and the second input signal is a scanning start signal or a gate signal of a next stage.

12. A gate driving circuit comprising a shift register having a plurality of stages cascaded to one another, each of the plurality of stages including
    a pull-up unit outputting a first clock signal as a gate signal in response to a signal of a first node to which a first input signal is applied;
    a pull-down unit discharging the gate signal to a level of a gate-off voltage if a second input signal is inputted;
    a discharging unit discharging a signal of the first node in response to the second input signal to the level of gate-off voltage; and
    a holding unit holding the signal of the first node in response to the first clock signal at a level of the gate signal discharged to the level of the gate-off voltage,
    wherein a first area in which an amorphous silicon thin film transistor is formed, and a second area in which a polysilicon thin film transistor is formed are provided in the gate driving circuit, and
    wherein the amorphous silicon thin film transistor and the polysilicon, thin film transistor are configured to operate simultaneously.

13. A display device comprising:
    a display panel divided into a display area in which an image is displayed and a peripheral area surrounding the display area; and
    a gate driving circuit disposed in the peripheral area and including a shift register having a plurality of stages cascaded to one another to output a gate signal to a gate line, each of the plurality of stages including
    a pull-up unit outputting a first clock signal as a gate signal in response to a signal of a first node to which a first input signal is applied;
    a pull-down unit discharging the gate signal to a level of a gate-off voltage if a second input signal is inputted;
    a discharging unit discharging a signal of the first node in response to the second input signal to the level of gate-off voltage; and
    a holding unit holding the signal of the first node in response to the first clock signal at a level of the gate signal discharged to the level of the gate-off voltage,
    wherein at least one of the discharging unit and the holding unit includes an amorphous silicon thin film transistor and a polysilicon thin film transistor connected in parallel to each other, and
    wherein the amorphous silicon thin film transistor and the polysilicon thin film transistor are configured to operate simultaneously.

14. The display device of claim 13, comprising a first area in which the amorphous silicon thin film transistor is formed and a second area in which the polysilicon thin film transistor is formed, wherein the first area and the second area are sectioned.

15. The display device of claim 14, wherein the second area is annealed by laser.

16. The display device of claim 13, wherein the first clock signal and a second clock signal have phases opposite to each other.

17. The display device of claim 13, wherein the first input signal is a scanning start signal or a gate signal of a previous stage, and the second input signal is a scanning start signal or a gate signal of a next stage.

18. The display device of claim 13, wherein each of the amorphous silicon thin film transistor and the polysilicon thin film transistor has a gate electrode disposed below a source electrode and a drain electrode.

19. The display device of claim 13, wherein mobility of the polysilicon thin film transistor is about 4 to about 10 times that of an amorphous silicon thin film transistor.

20. The display device of claim 13, wherein the polysilicon thin film transistor has mobility of about 2 to about 10 $cm^2/Vs$.

21. The display device of claim 13, wherein the polysilicon thin film transistor is formed by performing laser annealing on an amorphous silicon thin film transistor.

22. The display device of claim 13, wherein the discharging unit has an amorphous silicon thin film transistor and a polysilicon thin film transistor, and each of the amorphous silicon thin film transistor and the polysilicon thin film transistor of the discharging unit has a gate electrode to which the second input signal is inputted, a drain electrode connected to the first node, and a source electrode to which the gate-off voltage is applied.

23. The display device of claim 13, wherein the holding unit has an amorphous silicon thin film transistor and a polysilicon thin film transistor, and each of the amorphous silicon thin film transistor and the polysilicon thin film transistor of the holding unit has a gate electrode to which the first clock signal is inputted, a drain electrode connected to the first node, and a source electrode connected to a gate line.

24. The display device of claim 13, wherein the display area includes a plurality of pixels and an amorphous silicon thin film transistor for controlling the plurality of pixels.

25. The display device of claim 13, further comprising a distributing unit mounted on the peripheral area, including a plurality of polycrystalline thin film transistors, receiving first image signals and distributing second image signals to respective data lines.

26. A display device comprising:
    a display panel divided into a display area in which an image is displayed and a peripheral area surrounding the display area; and
    a gate driving circuit disposed in the peripheral area and including a shift register having a plurality of stages cascaded to one another to output a gate signal to a gate line, each of the plurality of stages including
    a pull-up unit outputting a first clock signal as a gate signal in response to a signal of a first node to which a first input signal is applied;
    a pull-down unit discharging the gate signal to a level of a gate-off voltage if a second input signal is inputted;
    a discharging unit discharging a signal of the first node in response to the second input signal to the level of gate-off voltage; and
    a holding unit holding the signal of the first node in response to the first clock signal at a level of the gate signal discharged to the level of the gate-off voltage,
    wherein the gate driving circuit includes a first area in which an amorphous silicon thin film transistor is formed, and a second area in which a polysilicon thin film transistor is formed, and
    wherein the amorphous silicon thin film transistor and the polysilicon thin film transistor are configured to operate simultaneously.

27. The display device of claim 26, wherein at least one of the pull-up unit and the pull-down unit is formed on the second area.

28. A method for manufacturing a display device, the method comprising:
    forming a gate driving circuit including a plurality of amorphous thin film transistors on a display panel, the plurality of amorphous thin film transistors in the gate driving circuit divided into a first area and a second area; and
    crystallizing the amorphous thin film transistors formed in the first area into polycrystalline thin film transistors by annealing the first area using laser,
    wherein the gate driving circuit includes a shift register having a plurality of stages cascaded to one another, each of the plurality of stages including:
    a pull-up unit outputting a first clock signal as a gate signal in response to a signal of a first node to which a first input signal is applied;
    a pull-down unit discharging the gate signal to a level of a gate-off voltage if a second input signal is inputted;
    a discharging unit discharging a signal of the first node in response to the second input signal to the level of gate-off voltage; and
    a holding unit holding the signal of the first node in response to the first clock signal at a level of the gate signal discharged to the level of the gate-off voltage
    wherein at least one of the pull-up unit, the pull-down unit, the discharging unit and the holding unit includes an amorphous silicon thin film transistor in the first area and a polysilicon thin film transistor in the second area, which are connected in parallel to each other, and
    wherein the amorphous silicon thin film transistor and the polysilicon thin filer transistor are configured to operate simultaneously.

* * * * *